United States Patent
Chen et al.

(10) Patent No.: US 9,299,806 B2
(45) Date of Patent: Mar. 29, 2016

(54) HIGH VOLTAGE DRAIN-EXTENDED MOSFET HAVING EXTRA DRAIN-OD ADDITION

(71) Applicant: Taiwan Semiconductor Manufacturing Company, Ltd., Hsin-Chu (TW)

(72) Inventors: Yi-Sheng Chen, Hsin-Chu (TW);
Chen-Liang Chu, Hsin-Chu (TW);
Shih-Kuang Hsiao, Hsin-Chu (TW);
Fei-Yuh Chen, Hsin-Chu (TW);
Kong-Beng Thei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/715,150

(22) Filed: May 18, 2015

(65) Prior Publication Data

US 2015/0249144 A1  Sep. 3, 2015

Related U.S. Application Data

(62) Division of application No. 13/686,696, filed on Nov. 27, 2012, now Pat. No. 9,035,380.

(51) Int. Cl.
*H01L 21/336* (2006.01)
*H01L 29/66* (2006.01)
*H01L 29/78* (2006.01)
*H01L 29/06* (2006.01)
*H01L 29/417* (2006.01)

(52) U.S. Cl.
CPC ...... *H01L 29/66681* (2013.01); *H01L 29/0619* (2013.01); *H01L 29/41758* (2013.01); *H01L 29/7823* (2013.01); *H01L 29/7833* (2013.01)

(58) Field of Classification Search
CPC .................................................. H01L 21/336
See application file for complete search history.

(56) References Cited

U.S. PATENT DOCUMENTS

| | | | |
|---|---|---|---|
| 5,492,847 | A | 2/1996 | Kao et al. |
| 2005/0104135 | A1 | 5/2005 | Sugihara |
| 2008/0290411 | A1 | 11/2008 | Lee |

FOREIGN PATENT DOCUMENTS

| CN | 1604340 | 4/2005 |
|---|---|---|
| CN | 102412155 | 4/2012 |

OTHER PUBLICATIONS

Hussin, M.R.M., et al., "Blanket and Pocket Anti Punchthrough Device Design Approaches in 0.35-um CMOS Technology Development," ICSE2000 Proceedings, Nov. 2000, pp. 39-43.

*Primary Examiner* — Marvin Payen
(74) *Attorney, Agent, or Firm* — Slater & Matsil, L.L.P.

(57) ABSTRACT

An integrated circuit and a method of forming is provided. The method includes forming a first well in a substrate, the first well having a first conductivity type, and forming a first source/drain region in the first well, the first source/drain region having a second conductivity type. A resistance protection ring is formed on the substrate.

18 Claims, 6 Drawing Sheets

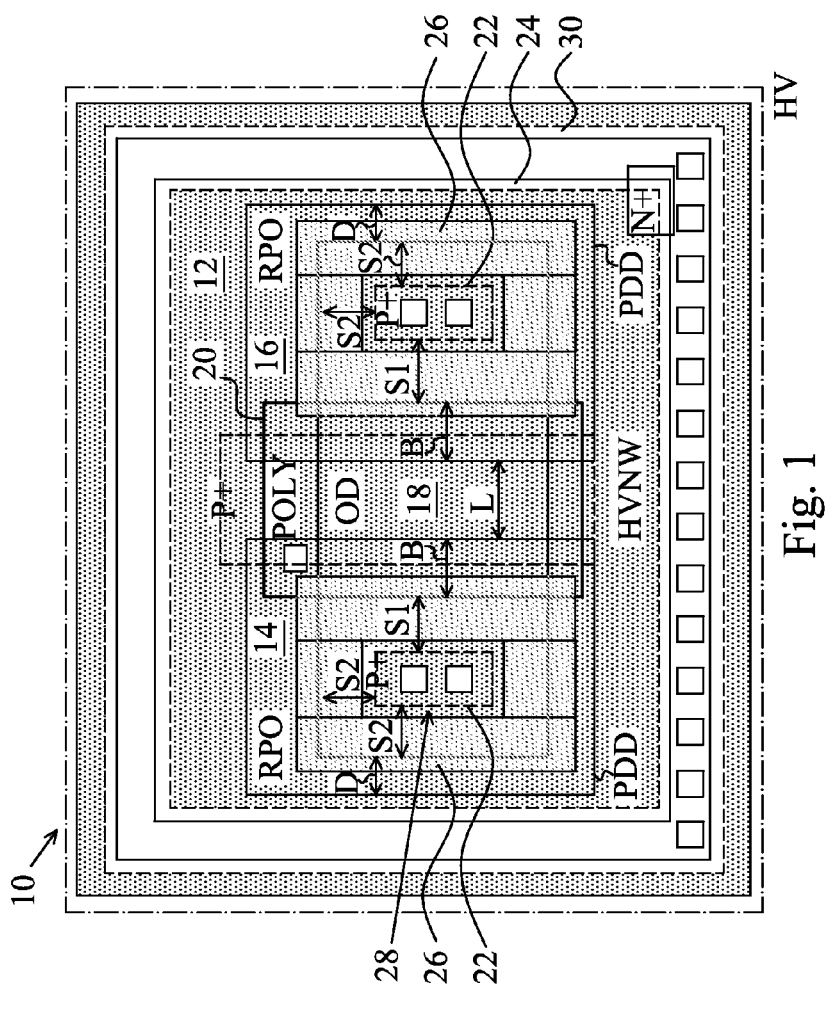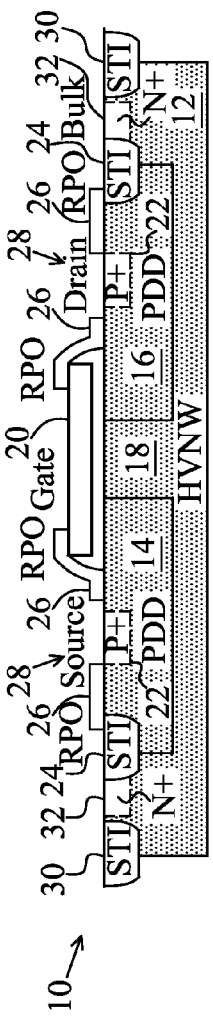
Fig. 1
Fig. 2

| Structure | Device | C018 27V test vehicle WAT | | | | | | WAT |
|---|---|---|---|---|---|---|---|---|
| | | W | L | B | S1 | D | S2 | Mean |
| W/O S2 | Asym_PMOS | 20 | 1.5 | 0.8 | 0.8 | 0.8 | NA | -1.047 |
| | | 20 | 1.5 | 0.8 | 0.8 | 0.8 | NA | -9.54 |
| | | 20 | 1.5 | 0.8 | 0.8 | 0.8 | NA | -32.00 |
| | | 20 | 1.5 | 0.8 | 0.8 | 0.8 | NA | -3.69 |
| W/O S2 | Sym_PMOS | 20 | 1.5 | 0.8 | 0.8 | 0.8 | NA | -0.977 |
| | | 20 | 1.5 | 0.8 | 0.8 | 0.8 | NA | -7.47 |
| | | 20 | 1.5 | 0.8 | 0.8 | 0.8 | NA | -32.13 |
| | | 20 | 1.5 | 0.8 | 0.8 | 0.8 | NA | -2.83 |
| | | 20 | 1.5 | 0.8 | 0.8 | 0.8 | NA | 0.03 |
| W/I S2 | Asym_PMOS | 20 | 1.5 | 0.8 | 0.8 | 0.8 | 0.8 | -1.016 |
| | | 20 | 1.5 | 0.8 | 0.8 | 0.8 | 0.8 | -9.59 |
| | | 20 | 1.5 | 0.8 | 0.8 | 0.8 | 0.8 | -37.60 |
| | | 20 | 1.5 | 0.8 | 0.8 | 0.8 | 0.8 | -2.95 |
| W/I S2 | Sym_PMOS | 20 | 1.5 | 0.8 | 0.8 | 0.8 | 0.8 | -0.956 |
| | | 20 | 1.5 | 0.8 | 0.8 | 0.8 | 0.8 | -7.28 |
| | | 20 | 1.5 | 0.8 | 0.8 | 0.8 | 0.8 | -37.43 |
| | | 20 | 1.5 | 0.8 | 0.8 | 0.8 | 0.8 | -2.94 |
| | | 20 | 1.5 | 0.8 | 0.8 | 0.8 | 0.8 | 0.02 |

Fig. 4

HIGH VOLTAGE DRAIN-EXTENDED MOSFET HAVING EXTRA DRAIN-OD ADDITION

This application is a divisional of U.S. patent application Ser. No. 13/686,696, filed on Nov. 27, 2012, entitled "High Voltage Drain-Extended MOSFET Having Extra Drain-OD Addition," which application is hereby incorporated herein by reference.

BACKGROUND

The breakdown voltage of the traditional Double Diffused Drain (DDD) metal-oxide semiconductor (MOS) structure (DDDMOS) is limited. A rule extension will only slightly improve the device breakdown voltage when the dopant concentration is light. In addition, the insertion of a shallow trench isolation (STI) region under a polyimide gate will decrease the on resistance, commonly referred to as RDS(on), and will degrade the mismatch performance of the device.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 is a top plan view of an embodiment DDDMOS device having a drain-active area (OD) addition in the form of a resistance protection oxide (RPO) forming a window;

FIG. 2 is a cross sectional view of the embodiment DDDMOS device of FIG. 1;

FIG. 4 is a chart illustrating wafer acceptance test (WAT) results for a standard DDDMOS device without the resistance protection oxide (RPO) forming a window relative to the embodiment DDDMOS device of FIG. 1;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3:
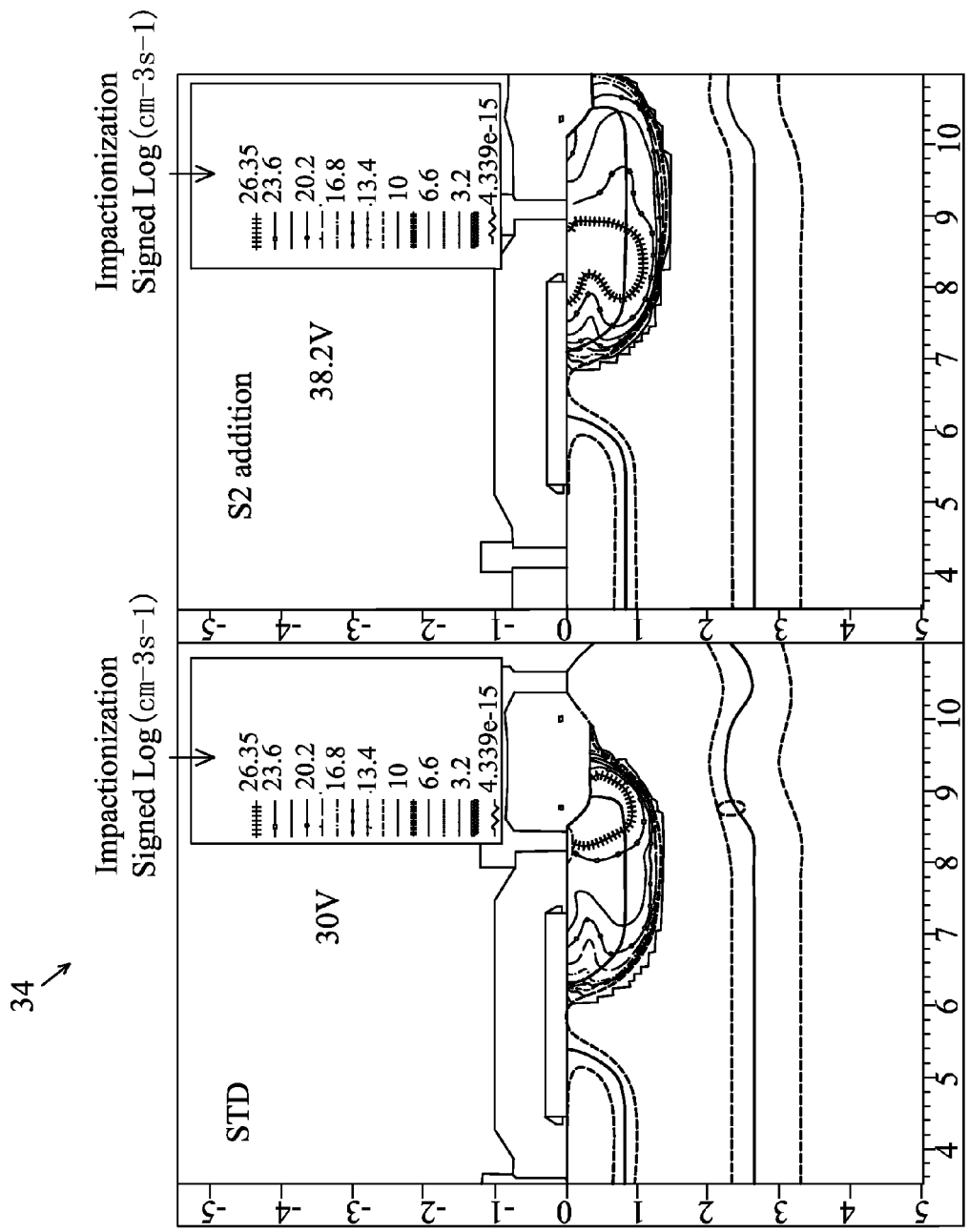
FIG. 3 is a simulation comparing the breakdown voltage expected for a standard DDDMOS device relative to the breakdown voltage expected for the DDDMOS device of FIG. 1.

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a metal-oxide semiconductor (MOS) transistor (e.g., a Double Diffused Drain MOS (DDDMOS), etc.). The concepts in the disclosure may also apply, however, to integrated circuits or other semiconductor structures.

Referring collectively to FIGS. 1-2, an embodiment DDDMOS device 10 is illustrated. As will be more fully described below, the embodiment DDDMOS device 10 has a high breakdown voltage relative to conventional DDDMOS devices. The embodiment DDDMOS device 10 also has a comparable on resistance, which is often indicated by RDS (on), and mismatch relative to conventional DDDMOS devices.

As shown in FIGS. 1-2, the DDDMOS device 10 includes a high-voltage well 12 having a first doping type (e.g., n-type). A first doped region 14 and a second doped region 16 are formed by implantation processes and embedded in the high-voltage well 12. In an embodiment, the first and second doped regions 14, 16 are lightly-doped drain regions. The first and second doped regions 14, 16 have a second doping type (e.g., p-type) and are spaced apart from each other by a channel 18 in the high-voltage well 12. The channel 18 is disposed beneath a gate 20. In an embodiment, the gate 20 is formed from a polysilicon or another suitable gate material.

Still referring to FIGS. 1-2, a source/drain region 22 is formed in the first doped region 14 and in the second doped region 16. Each of the source/drain regions 22 has the second doping type (e.g., p-type) and is more heavily doped than the first and second doped regions 14, 16. The heavier doping of the first and second doped regions 14, 16 is designated through use of the P+ symbol in FIG. 2. As shown in FIG. 1, the gate 20, the first and second doped regions 14, 16, and the source/drain regions 22 generally establish an active region (OD) for the DDDMOS device 10.

As shown in FIGS. 1-2, each of first isolation regions 24 is spaced apart from each of the source/drain regions 22. In an embodiment, the first isolation regions 24 comprise a shallow trench isolation (STI) region embedded in a portion of the first and second doped regions 14, 16 and in a portion of the high-voltage well 12. In other words, the first isolation regions 24 span across an interface between the first and second doped regions 14, 16 and the high-voltage well 12. In an embodiment, the first isolation regions 24 are laterally spaced apart from the source/drain regions 22 by portions of the first doped region 14 and portions of the second doped region 16.

Still referring to FIGS. 1-2, a resistance protection oxide (RPO) 26 forms a ring around each of the source/drain regions 22. As shown in FIG. 1, the ring of resistance protection oxide 26 defines a window 28 or opening that is generally aligned with or partially overlaps each of the source/drain regions 22. In an embodiment, the resistance protection oxide 26 overlies the first and second doped regions 14, 16 disposed between the source/drain regions 22 and the first isolation regions 24. In an embodiment, the resistance protection oxide 26 partially overlaps the first isolation regions 24. In an embodiment, the resistance protection oxide 26 includes a portion that is disposed on a side of the source/drain regions 22 opposite the channel 18.

As shown in FIG. 2, in an embodiment a portion of each of the rings of the resistance protection oxide 26 overlies the gate 20 disposed above the channel 18. In addition, in an embodiment an end of the resistance protection oxide 26 is vertically aligned with or partially overlaps an end of the source/drain regions 22 as shown in FIG. 2. Moreover, in an embodiment the ring 26 formed using the resistive protection oxide 26 is a square ring, a rectangular ring, and so on. It should be recognized that the ring may have other suitable shapes in other embodiments (e.g., circular, elliptical, triangular, or another closed polygon capable of forming a window).

Referring to FIG. 2, in an embodiment second isolation regions 30 are spaced apart from the first isolation regions 24 by a third doped region 32. The third doped region 32 has the first doping type (e.g., n-type) and is more heavily doped than the high-voltage well 12. The heavier doping of the third doped region 32 is designated through use of the N+ symbol in FIG. 2.

Referring now to FIG. 3, a simulation 34 comparing the breakdown voltage (i.e., 30 V) expected for a standard DDDMOS device 10 (labeled STD) relative to the breakdown voltage (e.g., 38.2 V) expected for the embodiment DDDMOS device 10 (labeled S2 addition) of FIG. 1 is provided. As shown, the breakdown voltage of the embodiment DDDMOS device 10 is significantly higher.

Referring now to FIG. 4, a chart 36 illustrating wafer acceptance test (WAT) results for a standard DDDMOS device without (W/O) the resistance protection oxide (RPO) and for the embodiment DDDMOS device 10 of FIG. 1 are provided. Notably, numerical values (in μm) for the various dimensions labeled in FIG. 1, namely W, L, B, S1, D, and S2, have been included in FIG. 4. Moreover, both symmetrical and asymmetrical PMOS device results have been provided.

Figure 5:
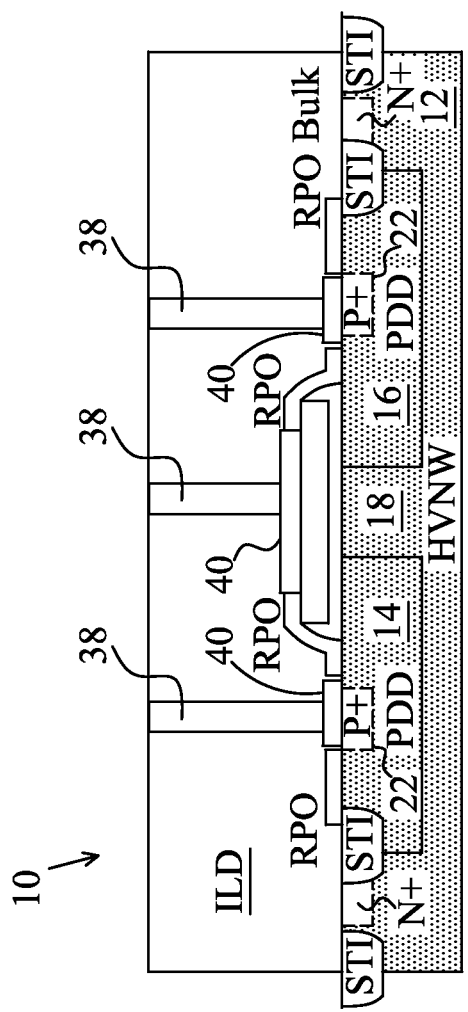
FIG. 5 is a cross section of the embodiment DDDMOS device of FIG. 1 having silicide formed beneath contact plugs.

Referring now to FIG. 5, the embodiment DDDMOS device 10 is depicted with contact plugs 38. As shown, a layer of silicide 40 is formed or resides between the outer contact plugs 38 and the source/drain regions 22 and between the central contact plug 38 and the gate 20. As shown, the resistance protection oxide 26 beneficially inhibits or prevents the formation of the silicide 40 over portions of the adjacent first and second doped regions 14, 16.

Figure 6:
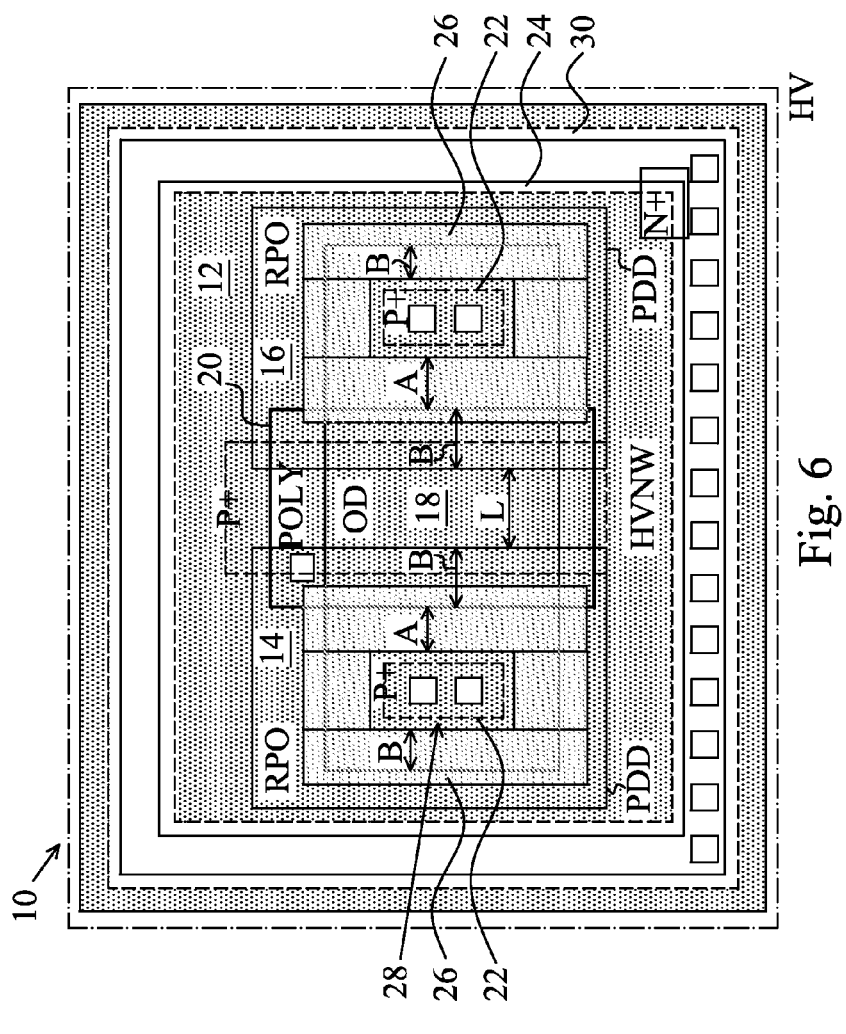
FIG. 6 is a top plan view of the embodiment DDDMOS device of FIG. 1 with certain dimensions illustrated.
Figure 7:
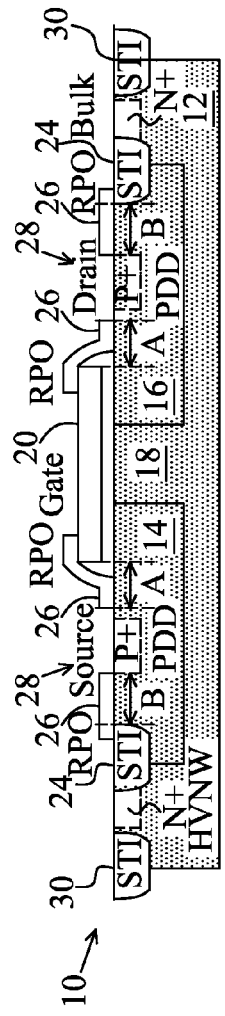
FIG. 7 is a cross sectional view of the embodiment DDDMOS device of FIG. 6.

Referring now to FIGS. 6-7, the embodiment DDDMOS device 10 has various dimensions labeled, namely A and B. In general, A is the distance from an end of a polysilicon gate 20 to a terminal end of the resistance protection oxide 26 and B is the distance from an edge of the first isolation regions 24 to an edge of the source/drain regions 22. In an embodiment, B is about 0.5 to about 1.5 times A. By way of example, if A is about 0.8 μm, then B is between about 0.4 μm to about 1.2 μm.

Figure 8:
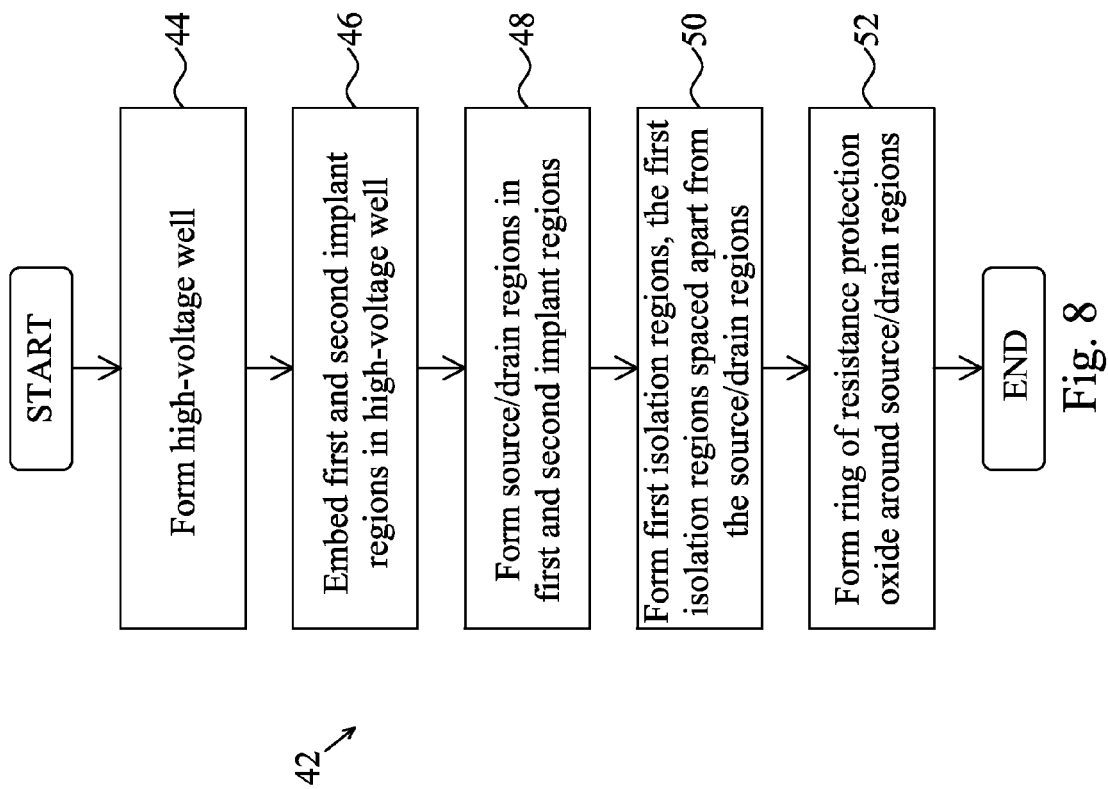
FIG. 8 is a flow diagram illustrating a method of forming the embodiment DDDMOS device of FIG. 1.

Referring now to FIG. 8, a flow diagram illustrating a method 42 of forming the embodiment DDDMOS device 10 of FIG. 1 is provided. In block 44, a high-voltage well 12 having the first doping type is formed. In block 46, the first doped region 14 and the second doped region 16 are embedded in the high-voltage well 12. As noted above, the first and second doped regions 14, 16 have the second doping type and are spaced apart by the channel 18 in the high-voltage well 12.

In block 48, source/drain regions 22 are formed in the first doped region 14 and in the second doped region 16. Each of the source/drain regions 22 has the second doping type and more heavily doped than the first and second doped regions 14, 16. In block 50, the first isolation regions 24 are formed. The first isolation regions 24 are spaced apart from each of the source/drain regions 22.

In block 52, the ring 26 of resistance protection oxide 26 is formed around each of the source/drain regions 22. By forming the ring 26 in this manner generating the window 28 (FIG. 1), the DDDMOS device 10 of FIG. 1 has a high breakdown voltage relative to conventional DDDMOS devices. In addition, the embodiment DDDMOS device 10 also has a comparable on resistance RDS(on) and mismatch relative to conventional DDDMOS devices.

An embodiment integrated circuit includes a high-voltage well having a first doping type, a first doped region and a second doped region embedded in the high-voltage well, the first and second doped regions having a second doping type and spaced apart by a channel in the high-voltage well, source/drain regions formed in the first doped region and in the second doped region, each of the source/drain regions having the second doping type and more heavily doped than the first and second doped regions, first isolation regions spaced apart from each of the source/drain regions, and resistance protection oxide over the high-voltage well forming a ring surrounding each of the source/drain regions.

An embodiment integrated circuit includes a high-voltage well having a first doping type, a first doped region and a second doped region embedded in the high-voltage well, the first and second doped regions having a second doping type and spaced apart by a channel in the high-voltage well, source/drain regions formed in the first doped region and in the second doped region, each of the source/drain regions having the second doping type and more heavily doped than the first and second doped regions, isolation regions spaced apart from each of the source/drain regions, and resistance protection oxide forming a window, the window at least one of aligned with and partially overlapping each of the source/drain regions.

An embodiment method of forming an integrated circuit includes forming a high-voltage well having a first doping type, embedding a first doped region and a second doped region in the high-voltage well, the first and second doped regions having a second doping type and spaced apart by a channel in the high-voltage well, forming source/drain regions in the first doped region and in the second doped region, each of the source/drain regions having the second doping type and more heavily doped than the first and second doped regions, forming first isolation regions, the first isolation regions spaced apart from each of the source/drain regions, and forming a ring of resistance protection oxide around each of the source/drain regions.

In another embodiment, a method of forming an integrated circuit is provided. The method includes forming a first well in a substrate, the first well having a first conductivity type, and forming a first source/drain region in the first well, the first source/drain region having a second conductivity type. A first resistance protection ring on the substrate, the first resistance protection ring extending around the first source/drain region in a plan view.

In yet another embodiment, a method of forming an integrated circuit is provided. The method includes forming a first well in a substrate, the first well having a first conductivity type, and forming a first isolation region in the substrate. A first doped region having a second conductivity type is formed, the first doped region adjacent the first isolation region. A gate electrode is formed over the substrate;, and a first source/drain region is formed in the first doped region, the first source/drain region having the second conductivity type, the first source/drain region being spaced apart from the first isolation region. A first resistance protection layer is formed over the substrate, the first resistance protection ring extending over a region interposed between the first source/drain region and the first isolation region and over a region interposed between the first source/drain region and the gate electrode.

In yet another embodiment, a method of forming an integrated circuit is provided. The method includes forming a high-voltage well having a first doping type and implanting a first doped region and a second doped region in the high-voltage well, the first and second doped regions having a second doping type and spaced apart by a channel in the high-voltage well. Source/drain regions are formed in the first doped region and in the second doped region, each of the source/drain regions having the second doping type and more heavily doped than the first and second doped regions, and first isolation regions are formed spaced apart from each of the source/drain regions, and forming a ring of resistance protection oxide around each of the source/drain regions.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming an integrated circuit, the method comprising:
   forming a first well in a substrate, the first well having a first conductivity type;
   forming a first source/drain region in the first well, the first source/drain region having a second conductivity type;
   forming a first isolation region;
   forming a gate electrode over a channel region, the channel region being interposed between the first source/drain region and a second source/drain region; and
   forming a first resistance protection ring on the substrate, the first resistance protection ring extending around the first source/drain region and along a sidewall of the gate electrode in a plan view,
   wherein the first resistance protection ring overlaps the first isolation region.

2. The method of claim 1, further comprising forming a first doped region of the second conductivity type in the first well, the first source/drain region being in the first doped region, the first source/drain region having a higher concentration of dopants of the second conductivity type than the first doped region.

3. The method of claim 1, further comprising:
   forming a second source/drain region in the first well, the second source/drain region having the second conductivity type; and
   forming a second resistance protection ring on the substrate, the second resistance protection ring extending around the second source/drain region in the plan view.

4. The method of claim 1, wherein the first resistance protection ring extends over at least a portion of a top surface of the gate electrode.

5. The method of claim 1, wherein a first shortest distance from an interior edge of the first resistance protection ring to an edge of the first isolation region is 0.5 to 1.5 times a second shortest distance from an interior edge of the first resistance protection ring to an edge of the gate electrode.

6. The method of claim 5, wherein the first shortest distance is about 0.4 µm to about 1.2 µm and the second shortest distance is about 0.8 µm.

7. A method of forming an integrated circuit, the method comprising:
   forming a first well in a substrate, the first well having a first conductivity type;
   forming a first isolation region in the substrate;
   forming a first doped region in the substrate, the first doped region having a second conductivity type, the first doped region adjacent the first isolation region;
   forming a gate electrode over the substrate;
   forming a first source/drain region in the first doped region, the first source/drain region having the second conductivity type, the first source/drain region being spaced apart from the first isolation region; and
   forming a first resistance protection layer over the substrate, the first resistance protection ring extending over a region interposed between the first source/drain region and the first isolation region and over a region interposed between the first source/drain region and the gate electrode.

8. The method of claim 7, wherein the first resistance protection layer forms a ring in a plan view around the first source/drain region.

9. The method of claim 7, wherein a first shortest distance from an interior edge of the first resistance protection ring to an edge of the first isolation region is about 0.4 µm to about 1.2 µm.

10. The method of claim 9, wherein a second shortest distance from an interior edge of the first resistance protection ring to an edge of the gate electrode is about 0.8 µm.

11. The method of claim 7, wherein the forming the first resistance protection layer is performed after the forming the gate electrode, and wherein the first resistance protection layer overlaps the gate electrode.

12. A method of forming an integrated circuit, the method comprising:
   forming a high-voltage well having a first doping type;
   implanting a first doped region and a second doped region in the high-voltage well, the first and second doped regions having a second doping type and spaced apart by a channel in the high-voltage well;
   forming source/drain regions in the first doped region and in the second doped region, each of the source/drain regions having the second doping type and more heavily doped than the first and second doped regions;
   forming first isolation regions, the first isolation regions spaced apart from each of the source/drain regions; and
   forming a ring of resistance protection oxide around each of the source/drain regions.

13. The method of claim 12, further comprising forming the resistance protection oxide over portions of the first and second doped regions disposed between the source/drain regions and the isolation regions.

14. The method of claim 12, further comprising laterally spacing the first isolation regions apart from the source/drain regions by portions of the first doped region and portions of the second doped region.

15. The method of claim 12, further comprising forming a gate electrode over a channel, wherein the ring of resistance protection oxide overlaps the gate electrode.

16. The method of claim 15, wherein an interior edge of the ring is spaced apart from an edge of the gate electrode by about 0.8 µm.

17. The method of claim 12, wherein the ring of resistance protection oxide overlaps the first isolation regions.

18. The method of claim 12, wherein the ring has a shape of a rectangle in a plan view.

* * * * *